United States Patent [19]

Olney

[11] Patent Number: 5,602,409
[45] Date of Patent: Feb. 11, 1997

[54] BIDIRECTIONAL ELECTRICAL OVERSTRESS PROTECTION CIRCUIT FOR BIPOLAR AND BIPOLAR-CMOS INTEGRATED CIRCUITS

[75] Inventor: Andrew H. Olney, Burlington, Mass.

[73] Assignee: Analog Devices, Inc., Norwood, Mass.

[21] Appl. No.: 501,999

[22] Filed: Jul. 13, 1995

[51] Int. Cl.⁶ .................................................. H01L 23/62
[52] U.S. Cl. ...................... 257/362; 257/358; 257/361
[58] Field of Search ................................... 257/355, 358, 257/360–363; 361/56

[56] References Cited

U.S. PATENT DOCUMENTS

| | | | |
|---|---|---|---|
| 4,760,433 | 7/1988 | Young et al. | 257/362 |
| 4,939,616 | 7/1990 | Rountree | 361/56 |
| 5,012,317 | 4/1991 | Rountre | 357/38 |
| 5,140,401 | 8/1992 | Ker et al. | 357/43 |
| 5,212,618 | 5/1993 | O'Neill et al. | 361/56 |
| 5,392,185 | 2/1995 | Haas, Jr. et al. | 361/56 |
| 5,455,436 | 10/1995 | Cheng | 257/362 |

FOREIGN PATENT DOCUMENTS

| | | |
|---|---|---|
| 60-173869 | 7/1985 | Japan . |
| 4-130657 | 1/1992 | Japan . |

OTHER PUBLICATIONS

LT1137A, "Advanced Low Power 5V RS232 Transceiver with Small Capacitors", Linear Technology Corporation, Interface Product Handbook 1993, pp. 1–13 to 1–19.
LT1237, "5V RS232 Transceiver with Advanced Power Management and One Receiver Active in Shut–Down", Linear Technology Corporation, Interface Product Handbook 1993, pp. 1–30 to 1–36.

Primary Examiner—Sara W. Crane
Assistant Examiner—Adriana Giordana
Attorney, Agent, or Firm—Koppel & Jacobs

[57] ABSTRACT

An electrical overstress (EOS) protection circuit includes a pair of contra-directed diode-connected bipolar EOS transistors connected between two integrated circuit (IC) terminals. One of the EOS transistors has a reverse-biased junction and the other has a forward-biased junction when a voltage is applied across the IC terminals. A pair of parasitic bipolar transistors are formed in series to provide a current path between the EOS transistors. When the voltage difference between the IC terminals exceeds the breakdown voltage of the EOS transistor with a reverse-biased junction as during an electrostatic discharge event, the parasitic transistors activate the EOS transistor with a reverse-biased junction to divert ESD current from the IC.

15 Claims, 4 Drawing Sheets

$V_{BP1} > V_{BP2}$ $V_{BP1} > V_{BP2}$ $V_{BP2} > V_{BP1}$ $V_{BP1} > V_{BP2} = GND$ $V_{BP1} > V_{BP2} = GND$ 5,602,409

BIDIRECTIONAL ELECTRICAL OVERSTRESS PROTECTION CIRCUIT FOR BIPOLAR AND BIPOLAR-CMOS INTEGRATED CIRCUITS

BACKGROUND OF THE INVENTION

1. Field of the Invention

This invention relates to protection circuitry for preventing damage to bipolar and bipolar-CMOS integrated circuits (ICs) due to electrical overstress (EOS) events, especially those arising from electrostatic discharge (ESD) events.

1. Description of the Related Art

EOS on an IC results from an external source discharging large transient voltages over a short period of time onto a terminal of the IC. EOS events include not only very fast transients such as ESD events which may result from human contact with the IC, but also slower transients such as power-up glitches. The purpose of an EOS protection circuit is to prevent damage to ICs during EOS events, especially those arising from ESD. It is desirable for EOS protection circuits to draw negligible leakage currents in their inactive state so that the IC can operate uninterrupted, and to quickly activate and divert current away from the IC when its voltage tolerance is exceeded as occurs during EOS events. A significant feature of an EOS protection circuit is its activation voltage, which should ideally be just above the highest breakdown voltage of the transistors on the IC. This ensures that the protection circuit is in the inactive state during normal IC operation, but activates at the lowest possible voltage beyond the transistor operating limits. Furthermore, EOS circuits should dissipate high peak voltages and currents without damage to either the IC or the EOS circuit. Therefore, in the active state it is desirable that the EOS circuit have a low impedance and a low holding voltage to dissipate very high EOS peak currents.

An existing EOS protection circuit is disclosed in U.S. Pat. No. 5,212,618, O'Neill et al., May 18, 1993. In one embodiment, the circuit includes a first npn transistor which has its emitter connected to an input terminal and, through a base resistance, to its base. A second npn transistor has its emitter connected to the substrate and to its base through another resistor. The collectors of the two transistors are formed by a single n-doped tub. When a positive voltage is applied to the input terminal, the second transistor's p-type base forward biases to the tub, but the tub will not conduct until its voltage exceeds the second transistor's collector-emitter breakdown voltage with the base shorted to the emitter (BVces). When the tub conducts, the second transistor turns on, clamping the tub voltage to its collector-emitter breakdown voltage with the base open-circuited (BVceo) or less. When a negative voltage is applied to the input terminal, two diodes form. The first diode is from the second transistor's base to the tub and turns on when the tub is below the substrate by the forward-biased base-emitter junction voltage (1 Vbe). The second diode is the inherent substrate-to-tub diode which will forward bias when the tub is below the substrate by 1 Vbe. The two diodes conduct when the first transistor's emitter is pulled negative with respect to the tub by the first transistor's BVces. When the diodes turn on, the first transistor turns on and clamps the tub voltage to its emitter at the collector-emitter breakdown voltage with the base open circuited (BVceo) or less.

The circuit thus operates as an open circuit until a voltage equal to plus or minus BVces (typically 60 to 80 volts) is applied to the input pin. Once on, the circuit has a holding voltage of plus or minus BVceo (typically 40–50 volts) plus 1 Vbe. A drawback of this circuit is that the holding voltage is high. During high ESD currents, power dissipation will be high and potentially damaging to the IC being protected. Another disadvantage is that the circuit is connected between a circuit terminal and the substrate, offering no protection when an ESD occurs between two circuit terminals.

SUMMARY OF THE INVENTION

In light of the limitations associated with existing EOS circuits, the present invention provides a novel EOS protection circuit having a very low leakage current in the inactive state, a desirably high switching voltage, an ability to be connected between any two IC terminals, a high peak EOS tolerance, a low holding voltage and high power dissipation capability in the active state, and may be fabricated with both bipolar and bipolar/CMOS processes.

These objectives are achieved by providing a pair of contra-directed diode-connected bipolar EOS transistors in separate epitaxial tubs between two IC terminals being protected. This configuration provides one transistor with a forward-biased junction and one transistor with a reverse-biased junction in series between the protected terminals. The present EOS circuit also includes a pair of parasitic bipolar transistors, one associated with each EOS transistor, whose collector-emitter circuits are connected in series and provide a current path between the base terminals of the EOS transistors. When the voltage difference between the IC terminals is less than the breakdown voltage of the EOS transistor with the reverse-biased junction, the EOS circuit is in its inactive state with a high impedance and draws a low current. Once the voltage between the IC terminals exceeds this transistor breakdown voltage, as during an ESD event, an avalanche of minority carriers is produced which flows through the EOS transistor with the forward-biased junction and the parasitic transistors. This turns on the parasitic transistors which then turns on the EOS transistor with the reverse-biased junction, activating the EOS circuit to drain ESD current away from the IC. A low holding voltage is established between the IC terminals until the ESD event is over, allowing the EOS circuit to efficiently dissipate high ESD currents.

Various embodiments of the EOS circuit are described in detail below.

DETAILED DESCRIPTION OF THE INVENTION

Figure 1:
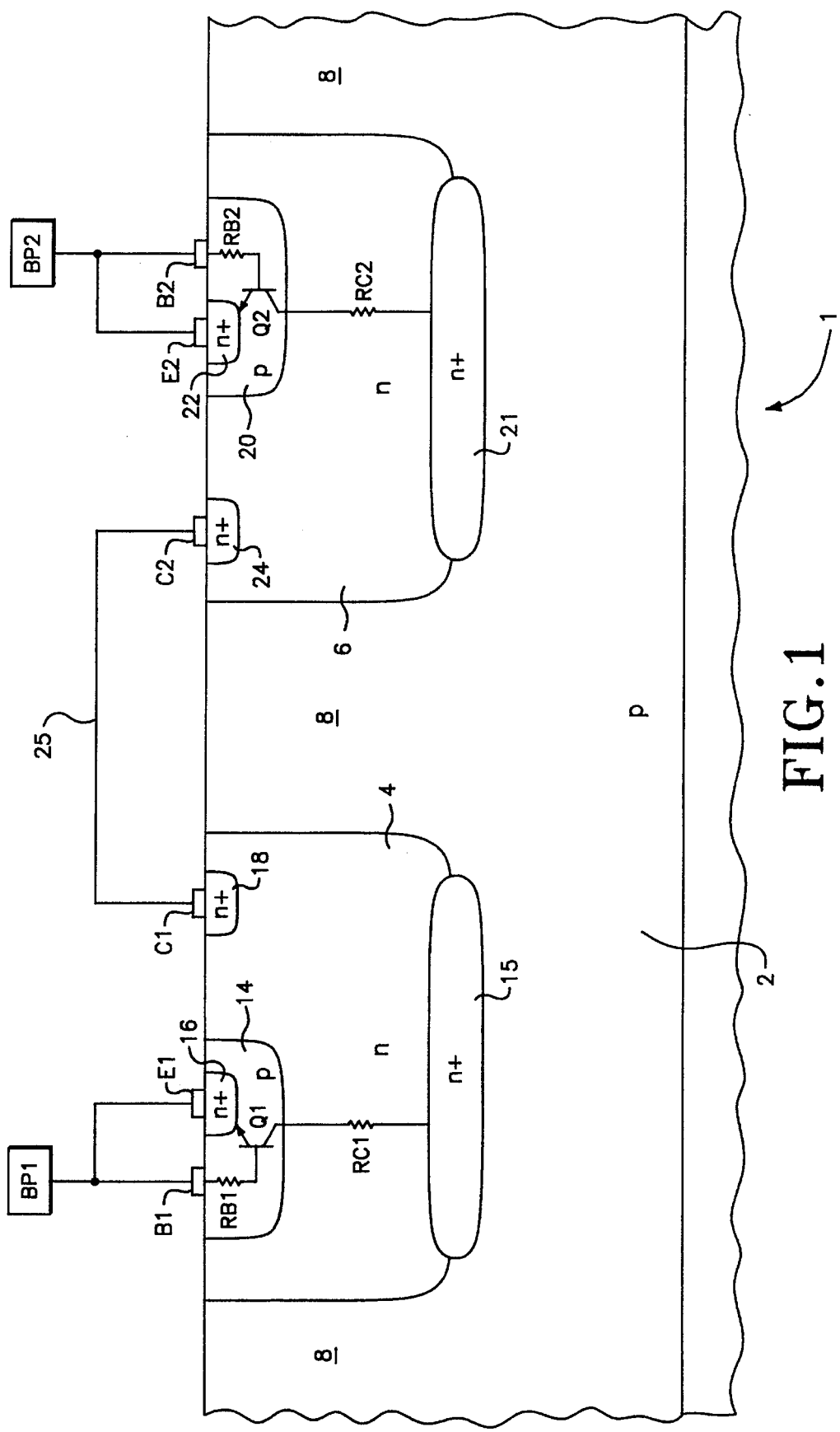
FIG. 1 is a sectional view illustrating an embodiment of the present EOS protection circuit.

FIG. 1 shows one embodiment of the present ESD protection circuit 1 which includes a pair of contra-directed diode-connected bipolar EOS transistors, Q1 and Q2, connected between two IC terminals BP1 and BP2 which are to be protected from EOS events. They are "contra-directed" in the sense that the transistors are connected in series but when forward biased are conductive in opposite directions, and "diode-connected" because their bases and emitters are connected together, which is one of the standard connections described in Grebene, *Bipolar and MOS Analog Integrated Circuit Design*, Wiley-Interscience, CH. 3 pp. 123–125, 1984, that allows a bipolar transistor to function like a diode. A p-doped substrate 2 has first and second n-doped epitaxial tubs, 4 and 6 respectively, formed in one surface. P-doped isolation regions 8, which extend from the substrate 2, define the vertical sides of the first and second epitaxial tubs, 4 and 6 respectively. A p-type well 14 which has a highly doped n-type (n+) region 16 formed therein is formed within first epitaxial tub 4. A highly doped n-type (n+) buried layer 15 is provided between the substrate 2 and epitaxial tub 4. A highly doped n-type (n+) region 18 is also formed in the first epitaxial tub 4, completing the configuration of the EOS circuit's first npn EOS transistor Q1. Base, emitter and collector contacts, B1, E1 and C1 are provided respectively on the upper surfaces of well 14 and regions 16 and 18.

A p-type well 20 with a highly doped n-type (n+) region 22 is formed within the second epitaxial tub 6. A highly doped n-type (n+) buried layer 21 is provided between the substrate 2 and epitaxial tub 6. A highly doped n-type (n+) region 24 is also formed in the second isolation tub 6, completing the configuration of a second npn EOS transistor Q2. Collector, base and emitter contacts, C2, B2 and E2 are provided respectively on the upper surfaces of region 24, well 20 and region 22.

Schematics symbols for Q1 and Q2 are superimposed on the semiconductor structure of FIG. 1. Q1's base contact B1 is connected, preferably by metalization, to Q1's emitter contact E1. This diode connection of Q1 produces a high collector-to-base/emitter reverse-bias breakdown voltage. The base diffusion resistance of Q1 is shown as RB1 (between its base and emitter), and may be augmented by an external resistor. Resistor RC1 is the collector resistance of Q1 and is a function of the epitaxial layer sheet resistance (n+ buried layer 15 reduces RC1's resistance). The portion of the first epitaxial tub 4 surrounding p-well 14 and contacted through n+ region 18 functions as Q1's collector, and Q1's emitter and base are connected to terminal BP1.

Q2 is similarly diode-connected with its base, formed by p-well 20, connected to its emitter which is formed by n+ region 22. Resistor RB2 is the base diffusion resistance of Q2 between its base and emitter, although an external resistor may also be used. Resistor RC2 is Q2's collector resistance and the portion of the second epitaxial tub 6 surrounding p-well 20 and contacted by C2 through n+region 24 functions as Q2's collector. Q2's emitter is connected to terminal BP2 on the IC being protected. Q1 and Q2 are contra-directed by electrically connecting their collectors together, preferably by a surface metalization 25. Q1 and Q2 are shown in FIG. 1 as transistors with npn conductivity, but the invention is equally applicable to transistors with pnp conductivity.

BP1 and BP2 may be any terminals on the IC, and are not limited to being reference voltage (power supply) terminals. The EOS circuit 1 can therefore be used to protect against EOS between any two IC terminals.

Q1 and Q2 each have a parasitic bipolar transistor of opposite polarity associated with them. Q1's pnp parasitic transistor is formed by pnp regions 14, 4 and 8, and Q2's pnp parasitic transistor is formed by pnp regions 20, 6 and 8. If the n-type and p-type semiconductor regions of FIG. 1 are reversed, the parasitic transistors will be npn. The parasitic transistors are not shown in FIG. 1 because the locations of their collectors and emitters depend upon whether the voltage at BP1 is less than or greater than the voltage at BP2. Since the parasitic transistors share the p-doped isolation region 8, they are connected in series from the collector of one to the emitter of the other. This forms a current path between the base terminals of Q1 and Q2 which, together with the current path 25 between C1 and C2, provides an overall current path between BP1 and BP2. During an ESD between BP1 and BP2, the current path provided by the parasitic transistors provides current to the EOS transistor (either Q1 or Q2) with the reverse-biased junction and turns it on to activate the EOS circuit 1. The role of the parasitic transistors will become apparent in the discussion of FIGS. 2–4.

Figure 2:
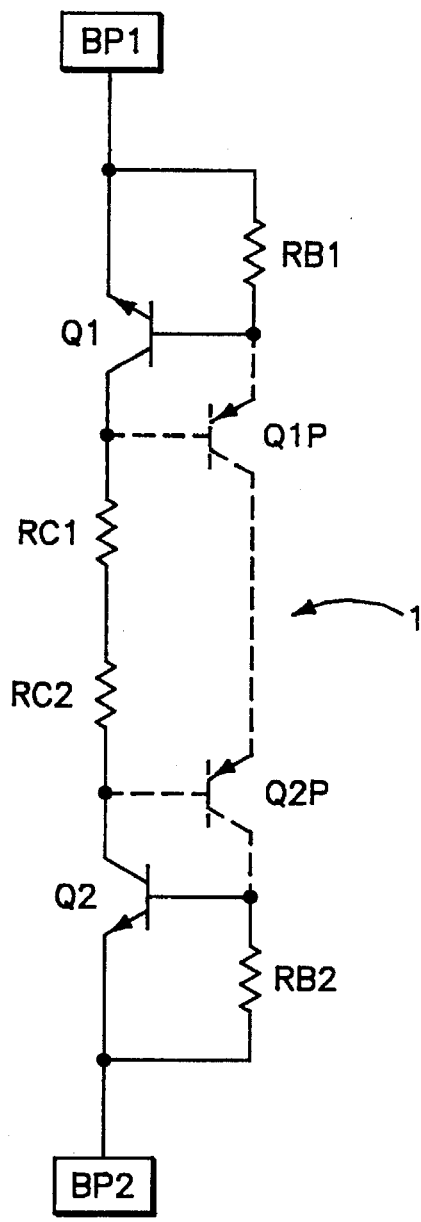
FIG. 2 is a schematic diagram illustrating the preferred embodiment of the present invention with the voltage at terminal BP1 greater than the voltage at terminal BP2.
Figure 3:
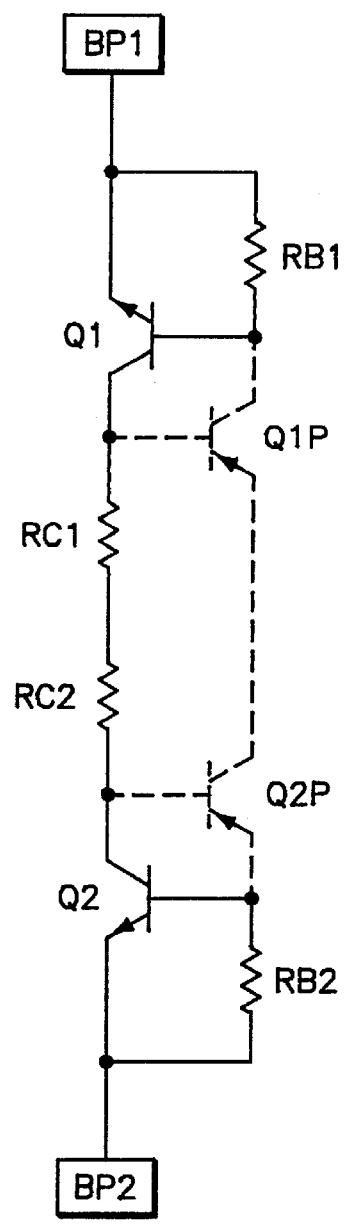
FIG. 3 is a schematic diagram illustrating the preferred embodiment of the present invention with the voltage at BP2 greater than at BP1.
Figure 4:
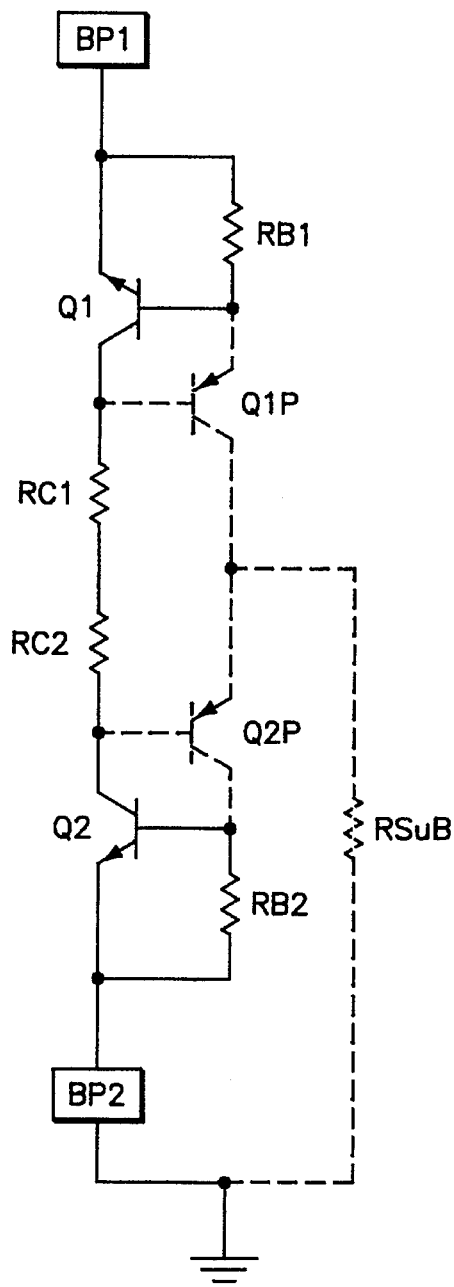
FIG. 4 is a schematic diagram illustrating another embodiment of the present invention with the substrate and BP2 grounded and the voltage at BP1 greater than at BP2.

Schematic diagrams of the EOS circuit are provided in the embodiments of FIGS. 2–4 to explain the circuit's operation. In FIGS. 2–4, the regions which function as the emitters and collectors of the parasitic transistors vary according to the polarity of the voltage across BP1 and BP2. Referring to FIG. 2, the EOS circuit 1 is shown with the voltage at BP1 (VBP1) greater than the voltage at BP2 (VBP2). The isolation regions 8 and the substrate 2 are not tied to a reference voltage such as ground and their voltage is thus floating during an EOS event between BP1 and BP2. Q1P and Q2P are the parasitic transistors of Q1 and Q2, respectively. They are shown in dashed lines, Q1's base being the emitter of Q1P and Q2's base being the collector of Q2P.

In operation, when VBP1 is greater than VBP2, the Q2 collector-base junction will be reverse-biased. If VBP1 minus VBP2 is less than Q2's collector-emitter breakdown voltage with the base shorted to the emitter (BVces), the EOS circuit 1 is inactive with little current flowing through Q1 and Q2. This is because when VBP1 is greater than VBP2 by less than Q2's BVces, Q1P's collector-base, Q2P's emitter-base and Q2's collector-base junctions are reverse-biased. This biasing provides a high impedance circuit between BP1 and BP2 with the EOS circuit drawing very small leakage currents. The leakage current drawn enters the EOS circuit at transistor Q1, which is operating in the inverted mode with its emitter-base junction rever- se-biased and its collector-base junction forward-biased. In this non-standard mode of operation, Q1's current gain is approximately an order of magnitude less than that for a standard-biased npn transistor. Consequently, the amplification of the leakage currents is suppressed by Q1's low gain. The overall leakage current to the ESD circuit is thus very small and does not disturb the IC's operation.

During an EOS event at BP1, VBP1 minus VBP2 is greater than Q2's BVces, which is approximately 60 volts, partially activating the EOS circuit 1 and producing an avalanche of minority carriers at Q2's reverse-biased collector-base junction. The avalanche current enters the protection circuitry at BP1 and flows through RB1 to the parallel combination of Q1's forward-biased collector-base and Q1P's forward-biased emitter-base junctions. The current divides, with Q1's base-to-collector current further flowing through resistors RC1 and RC2 to Q2's collector. As the ESD voltage increases, the avalanche current through Q1 and Q1P increases, turning them on. This pulls the voltage at the floating isolation/substrate, which is Q1P's collector, up towards Q1P's emitter voltage. The Q2P emitter voltage, which is equal to the floating isolation/substrate voltage, is also pulled up, forward biasing Q2P's emitter-base junction. This initiates a current flow through Q2P and, once the product of Q2P's collector current and Q2's base resistor RB2 exceeds approximately 0.6 V, Q2 turns on. This fully activates the ESD circuit 1; the resulting Q2 collector current drives Q1 and Q1P into saturation, which in turn drives Q2P and then Q2 into saturation.

Once all of the transistors are saturated, a constant holding voltage is established between BP1 and BP2 which equals the sum of the voltages across RB1, Q1P's collector-emitter terminals at saturation, Q2P's emitter-collector terminals at saturation and Q2's base-emitter junction. The holding voltage is in the approximate range of 1.3–2.0 V, far lower than the EOS circuit's initial activation voltage of approximately 60 volts. This low holding voltage limits the power absorbed by the EOS circuit 1, which dissipates peak ESD currents up to approximately 5 amps without EOS circuit junction damage. Once the charge associated with the EOS is dissipated, the current through RB2 drops. Q2's base-emitter junction voltage decreases, and once it drops below approximately 0.6 V, Q2 turns off and the EOS circuit 1 reverts to its high impedance low leakage current inactive state.

FIG. 3 is a schematic of the FIG. 1 EOS circuit 1 with VBP2 greater than VBP1 (isolation regions 8 and the substrate 2 of FIG. 1 are again floating). Since the polarities of BP1 and BP2 are reversed, the collectors and emitters of Q1P and Q2P are reversed from the circuit of FIG. 2. Thus, Q1's base is Q1P's collector and Q2's base is Q2P's emitter. As in FIG. 2, Q1P and Q2P are still formed by the same semiconductor regions, but their collector and emitter regions have reversed.

When VBP2 is greater than VBP1, the EOS circuit 1 operates in a manner similar to the circuit described in FIG. 2. Thus, as long as VBP2 minus VBP1 is less than the collector-emitter breakdown voltage of Q1 with the base shorted to the emitter (BVces), Q2 operates in the inverted mode, displaying low gain. When VBP2 minus VBP1 exceeds Q1's BVces, which occurs during an EOS event, Q1 avalanches, resulting in a flow of current through RB2 to the parallel combination of Q2's forward-biased collector-base and Q2p's forward-biased emitter-base junctions. As the EOS voltage increases, Q2 and Q2P turn on, which then turn Q1P and Q1 on. The holding and triggering voltages are essentially the same as described above for the EOS circuit of FIG. 2. Once the EOS event is over, the current through RB1 drops, turning Q1 off and reverting the EOS circuit to its inactive state.

RB1 and RB2, whether implemented with the inherent base diffusion resistances or augmented by external resistors, are significant in the operation of the EOS circuit 1 because, during a positive EOS at BP1, RB1 factors into the holding voltage and RB2 factors into the level of current required at Q2P's collector to turn on Q2. Conversely, during a positive EOS event at BP2, RB2 factors into controlling the holding voltage and RB1 factors into the level of current required to turn Q1 on and activate the EOS circuit. In a preferred embodiment, RB1 and RB2 are each approximately 5 ohms, establishing the holding voltage at 1.3 to 2.0 volts.

FIG. 4 is a schematic diagram of another EOS circuit embodiment which may be used to protect a single supply IC. FIG. 4 is of an EOS circuit with the voltage at BP1 greater than the voltage at BP2. This circuit, which provides non-symmetrical EOS protection, uses the circuit layout shown in FIG. 1, except BP2 and the substrate are referenced to ground (thus, neither is floating). During normal IC operation, the grounded substrate reverse biases the p-n junctions formed from the p-isolation 8 and the substrate 2 to the n-type epitaxial tubs 4 and 6, making it possible to integrate this circuit with bipolar and bipolar-CMOS processes (the substrate could also be referenced to the most positive reference, usually for an n-type substrate). By grounding the substrate, Q1P's collector and Q2p's emitter, formed by the isolation region 8 between Q1 and Q2, are resistively shorted to ground through the substrate resistance RSUB. This circuit operates similarly to the floating isolation/substrate circuits of FIGS. 2 and 3 with the following exceptions, which depend upon the polarity of the EOS event.

If there is a positive EOS event at ground with respect to BP1, Q1's collector-base junction avalanches, sending current primarily through RSUB and Q1P's forward-biased emitter-base junction. Due to the polarity of this EOS event, the emitter and collector terminals of Q1P are reversed from that shown in FIG. 4. As this avalanche current increases, Q1P turns on and sends current through RB1. When the voltage across RB1 exceeds approximately 0.6 V, Q1 turns on and its collector current drives Q1P into saturation, which in turn drives Q1 into saturation. Consequently, a constant holding voltage is provided between ground and BP1 equal to the sum of the voltages across RSUB, Q1P's emitter-collector terminals at saturation and Q1's emitter-base junction. A preferred RSUB resistance of 6 ohms produces a holding voltage of approximately 1.0 V between ground and BP1.

If there is a positive EOS event at BP1 with respect to ground (the circuit shown in FIG. 4), Q2's collector-base junction avalanches, sending current primarily through RB1, the parallel combination of Q1's forward-biased collector-base and Q1P's emitter-base junctions, and RC1 and RC2. Q1 and Q1P turn on as in the operation of the floating isolation circuits of FIGS. 2 and 3, but Q2P only partially turns on since Q1P's collector current is partially shunted to ground through RSUB. As the EOS current builds up, Q2P's collector current flows through RB2, partially turning Q2 on. The current shunted by RSUB, however, prevents either Q2P or Q2 from reaching saturation. The holding voltage achieved is approximately 16.0 V.

Figure 5:
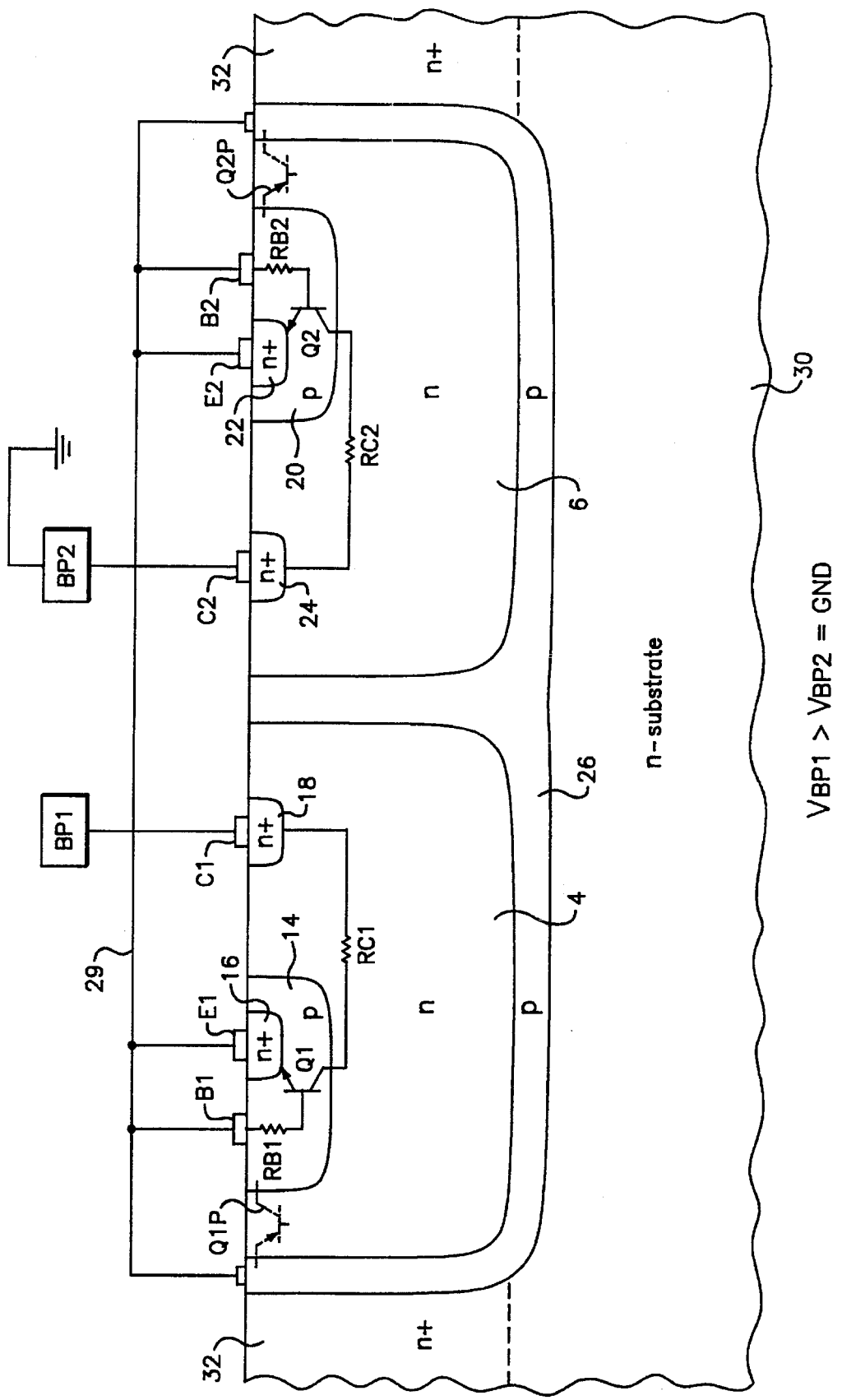
FIG. 5 is a sectional view illustrating an embodiment of the present EOS protection circuit that may be fabricated with both bipolar and bipolar/CMOS processes.

FIG. 5 is a sectional view of an embodiment of the present EOS circuit which is fabricated on a bipolar-CMOS process with an n-type substrate. The same reference numbers are employed in FIG. 5 as in FIG. 1 to refer to common semiconductor regions. The circuit of FIG. 5 includes p-type ring 26 formed around and in between n-type epitaxial tubs 4 and 6 such that tubs 4 and 6 are surrounded on all sides except their surface by p-type material. The p-type ring 26 is in turn set in an n-type substrate 30. Highly doped n-type (n+) isolation regions 32 extend from the substrate 30 up to the surface of the expitaxial tubs 4 and 6 to isolate the tubs 4 and 6 from other IC components. Epitaxial tubs 4 and 6 are isolated so that the EOS circuit may be fabricated on a bipolar-CMOS process with an n-type substrate without latch-up. Furthermore, the substrate 30 and n+ isolation regions 32 are connected to the most positive supply to preserve junction isolation in the bipolar-CMOS process.

A schematic of the resultant EOS protection circuit with the voltage at BP1 is greater than the voltage at BP2 is superimposed on the structure of FIG. 5. Q1 and Q2 are formed in the same regions as in FIG. 1. Q1P and Q2P, however, are different from FIG. 1, with the emitter, base and collector of Q1P consisting of p-type ring 26, n-type epitaxial tub 4 and p-well 14, respectively. The emitter, base and collector of Q2P are formed by p-well 20, n-layer 6 and p-type ring 26, respectively. The collector resistance of Q1 is resistor RC1 and the collector resistance of Q2 is resistor RC2.

Figure 6:
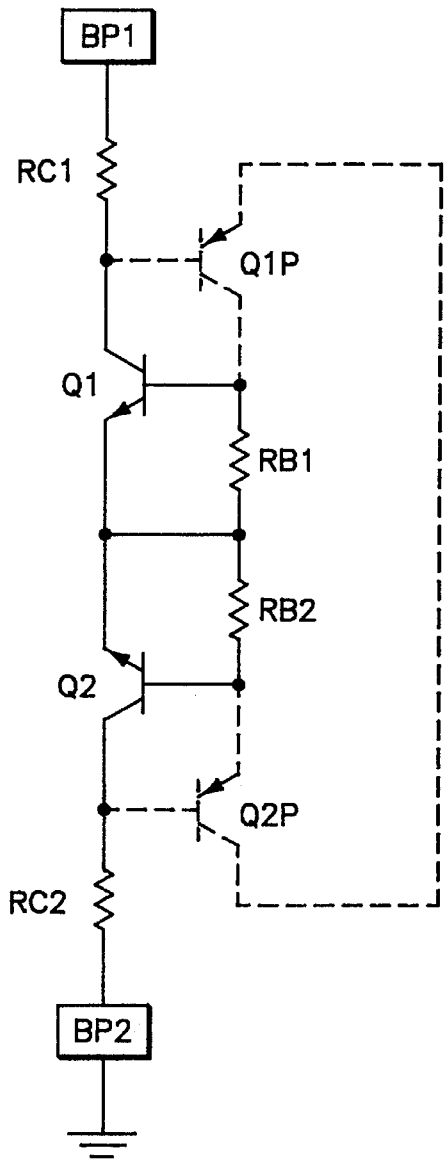
FIG. 6 is a schematic diagram of the ESD circuit shown in FIG. 5, with BP2 grounded and the voltage at BP1 greater than the voltage at BP2.

The regions where the emitters and collectors of Q1P and Q2P form vary according to the polarity of the voltage across BP1 and BP2. FIG. 6 is a schematic diagram of the FIG. 5 EOS circuit with the voltage at BP1 greater than the voltage at BP2. Q1 and Q2 and resistors RC1 and RC2 are shown in solid lines, and the parasitic transistors Q1P and Q2P are shown in dashed lines. The circuit is different from the circuits of FIGS. 2–4 in that the collectors of Q1 and Q2 are connected to the IC terminals BP1 and BP2, respectively. Furthermore, the emitters of Q1 and Q2 are connected together and to their respective bases through resistors RB1 and RB2. This produces a pair of contra-directed diode-connected bipolar EOS transistors, with one EOS transistor having a reverse-biased junction and the other having a forward-biased junction. Also, Q1P and Q2P are connected in series, from the collector of Q2P to the emitter of Q1P, to provide a current path between the bases of Q1 and Q2. If the voltage at BP2 is greater than the voltage at BP1, the emitter and collector terminals of Q1P and Q2P are reversed from those of the FIG. 6 circuit.

The protection provided by the EOS circuit of FIG. 6 depends upon the polarity of the voltage between BP1 and BP2. During a positive EOS event at BP1 with respect to BP2, Q1's collector-emitter breakdown voltage with the base shorted to the emitter, which is approximately 40 volts in this embodiment, will be exceeded, producing an avalanche current through Q1. This current flows through RB2 to the parallel combination of Q2's forward-biased collector-base and Q2P's forward-biased emitter-base junctions. Although this current may partially turn on Q2P, unlike with the previous embodiments, Q1P cannot subsequently be turned on since Q1P's base voltage is high (approximately equal to the positive EOS voltage at BP1 less the voltage drop across RC1) relative to its emitter voltage. This ensures that the Q1P emitter-base junction is always reverse-biased, keeping Q1P turned off. However, the layout of Q1 and Q2 is such that when BVces of either transistor is exceeded as during an EOS event, the transistor turns on in a different way. Specifically, referring to FIG. 5, when BVces of Q1 is exceeded, current flows primarily laterally from the C1 contact through the highly doped n-type (n+) collector region 18, through the p-type base layer 14, under highly doped n-type (n+) emitter region 16, and out of the B1 contact. This continuous flow of current through the base resistor RB1 results in a localized voltage drop across the p-type base layer 14. Once this voltage drop exceeds approximately 0.6 volts, Q1 partially turns on. Q1 does not fully turn on because its emitter and base terminals are connected together, preferably by a surface metalization 29, which allows only a portion of Q1's emitter-base junction to forward-bias.

Once the circuit activates, a holding voltage of approximately 26 volts between BP1 and BP2 is provided. Once the EOS event passes, the voltage across Q1's base resistor RB1 drops below approximately 0.6 volts, turning Q1 off and causing the EOS circuit to revert to its high impedance low leakage current inactive state.

During a positive EOS event at BP2 with respect to BP1, Q2's BVces is exceeded, producing an avalanche current through Q2. This current flows through RB1 to the parallel combination of Q1's forward-biased collector-base and Q1P's forward-biased emitter-base junctions. In a manner similar to the preceding opposite polarity case, the Q2P emitter-base junction is always reverse-biased, keeping Q2P turned off. Since the layouts of Q2 and Q1 are essentially the same, once BVces of Q2 is exceeded, current flows primarily laterally from the C2 contact through highly doped n-type (n+) collector region 24, through the p-type base layer 20, under highly doped n-type (n+) emitter region 22, and out of the B2 contact. The current through the base resistor RB2 results in a localized voltage drop across the p-type base layer 20 that partially turns on Q2 in a manner similar to the case described above where Q1 partially turns on. Once the circuit activates, a holding voltage of approximately 26 volts is provided from BP2 to BP1 until the EOS event passes.

In one application, EOS protection is provided to every terminal of the IC by connecting one EOS circuit shown in FIG. 6 between each IC terminal and ground. During a positive EOS event at ground, the EOS circuits function in parallel to dissipate EOS currents, the cumulative effect providing a holding voltage of approximately 1–2 volts between ground and the terminals of the EOS protection circuits.

Variations can be made to the embodiments described above. Referring to FIG. 1, highly doped n-plugs could be placed between the collectors of Q1 and Q2 and the n+ buried layers 15 and 21, respectively, to reduce the collector resistance and lower the holding voltage. Also, highly doped p-type (p+) regions could be placed under the base contacts B1 and B2 in FIGS. 1 and 5, or under the p-ring contacts in FIG. 5. Additionally, p-ring 26 could be separated in the middle by an n+ isolation region forming two p-rings, one around each of the epitaxial tubs, 4 and 6. The p-rings could also be tied to potentials other than B1/E1/B2/E2. Also, highly doped n-type (n+) buried layers may be provided between n-epitaxial tubs 4 and 6, and the p-ring 26. These variations can exist separately or in combination. Accordingly, the invention is intended to be limited only in terms of the appended claims.

I claim:

1. An electrical overstress (EOS) protection circuit connected between first and second integrated circuit (IC) terminals, comprising:

first and second contra-directed diode-connected bipolar EOS transistors of a first conductivity having emitter, base and collector terminals, connected in series between said first and second IC terminals, one of said EOS transistors having a reverse-biased junction and the other having a forward-biased junction in response to a voltage differential across said IC terminals such that said EOS circuit inhibits current flow between said IC terminals in response to a voltage differential less than the reverse breakdown voltage of said EOS transistor with a reverse-biased junction, and first and second parasitic bipolar transistors of a second conductivity having emitter, base and collector terminals, said parasitic transistors being connected in series to provide a current path between the base terminals of said EOS transistors that actuates the EOS transistor with a reverse-biased junction during an EOS event between said IC terminals.

2. An EOS protection circuit as in claim 1, wherein said first and second EOS transistors are connected together by their collectors, said first EOS transistor's base and emitter terminals being connected to said first IC terminal and said second EOS transistor's base and emitter terminals being connected to said second IC terminal.

3. An EOS protection circuit as in claim 2, further comprising a first base-emitter resistor connected between the base and emitter terminals of said first EOS transistor and a second base-emitter resistor connected between the base and emitter terminals of said second EOS transistor, said parasitic transistors providing a current through said base-emitter resistor of the EOS transistor with a reverse-biased junction to turn on said EOS transistor with a reverse-biased junction during an EOS event and activate said EOS protection circuit.

4. An EOS protection circuit as in claim 2, said circuit providing a holding voltage between said first and second IC terminals during an EOS event, said holding voltage being equal to the sum of the voltage across the base-emitter resistor of the EOS transistor with a forward-biased junction, the collector-to-emitter voltages of said parasitic transistors at saturation and the emitter-to-base voltage of the EOS transistor with a forward-biased junction at saturation.

5. An EOS protection circuit as in claim 2, wherein one of said IC terminals is a reference voltage terminal.

6. An EOS protection circuit as in claim 1, wherein said first conductivity is npn and said second conductivity is pnp.

7. An EOS protection circuit as in claim 1, wherein said first conductivity is pnp and said second conductivity is pnp.

8. An EOS protection circuit as in claim 1, wherein said collectors of said first and second EOS transistors are connected together and their base and emitter terminals are shorted together and connected to said first and second IC terminals respectively, and one of said IC terminals is a reference voltage terminal.

9. An electrical overstress (EOS) protection circuit connected between first and second integrated circuit (IC) terminals, comprising:
   a substrate of a first conductivity type,
   first and second tubs of a second conductivity type in a surface of said substrate,
   first and second wells of said first conductivity type inside said first and second tubs respectively,
   an isolation region in the surface of said substrate between said first and second tubs;
   first and second regions of said second conductivity type inside said first and second wells, respectively,
   said first well, said first region, and a portion of said first tub surrounding the first well forming base, emitter and collector terminals, respectively, that define a first diode-connected bipolar EOS transistor,
   said second well, said second region, and a portion of said second tub surrounding the second well forming base, emitter and collector terminals, respectively, that define a second diode-connected bipolar EOS transistor, said first and second EOS transistors being contra-directed connected in series between said first and second IC terminals,
   said first well, said first tub, and said isolation region forming a first parasitic bipolar transistor, and
   said second well, said second tub, and said isolation region forming a second parasitic bipolar transistor, said parasitic transistors providing a current path between said first and second EOS transistors during an EOS event between said IC terminals.

10. An EOS protection circuit as in claim 9, wherein said first and second EOS transistors collector and emitter terminals define respective collector-emitter circuits, said first well is connected to said first region, said second well is connected to said second region, and said first and second tubs are connected to connect the collector-emitter circuits of said first and second EOS transistors together in series between said first and second IC terminals.

11. An EOS protection circuit as in claim 10, further comprising first and second base-emitter resistors between said base and emitter terminals of said first and second EOS transistors, respectively, said parasitic transistors providing a current through said base-emitter resistor of the EOS transistor with a reverse-biased junction to turn it on during an EOS event and activate said EOS protection circuit.

12. An EOS protection circuit as in claim 10, wherein said substrate and one of said IC terminals are connected to ground.

13. An EOS protection circuit as in claim 12, wherein said first and second IC terminals are connected respectively to said first and second tubs, and said first well, first region, second well and second region are connected together.

14. An EOS protection circuit as in claim 9, wherein said first conductivity is p-type and said second conductivity is n-type.

15. An EOS protection circuit as in claim 9, wherein said first conductivity is n-type and said second conductivity is p-type.

* * * * *